US012608514B1

(12) United States Patent
Francis et al.

(10) Patent No.: US 12,608,514 B1
(45) Date of Patent: Apr. 21, 2026

(54) DETERMINATION OF HEAT SOURCE ABSORPTIVITY AND PENETRATION DEPTH IN ADDITIVE MANUFACTURING MELT POOLS

(71) Applicant: Ansys, Inc., Canonsburg, PA (US)

(72) Inventors: Zack Francis, Pittsburgh, PA (US); Chong Teng, Shandong (CN); Hai Dong, Zhejiang (CN)

(73) Assignee: Ansys, Inc., Canonsburg, PA (US)

( * ) Notice: Subject to any disclaimer, the term of this patent is extended or adjusted under 35 U.S.C. 154(b) by 786 days.

(21) Appl. No.: 16/798,950

(22) Filed: Feb. 24, 2020

Related U.S. Application Data

(60) Provisional application No. 62/958,896, filed on Jan. 9, 2020.

(51) Int. Cl.
*G06F 30/20* (2020.01)
*B29C 64/386* (2017.01)
*B33Y 50/00* (2015.01)

(52) U.S. Cl.
CPC ............ *G06F 30/20* (2020.01); *B29C 64/386* (2017.08); *B33Y 50/00* (2014.12)

(58) Field of Classification Search
None
See application file for complete search history.

(56) References Cited

U.S. PATENT DOCUMENTS

2017/0016839 A1* 1/2017 Rubenchik ............. G01N 25/20
2017/0151704 A1* 6/2017 Go ........................ B29C 48/266
2017/0266762 A1* 9/2017 Dave ..................... B33Y 50/02

OTHER PUBLICATIONS

Yu et al., On the role of processing parameters in thermal behavior, surface morphology and accuracy during laser 3D printing of aluminum alloy, 2016, IOP Publishing, pp. 1-15 (Year: 2016).*
Zhao et al., A novel optimization design method of additive manufacturing oriented porous structures and experimental validation, 2019, Elsevier, pp. 1-12 (Year: 2019).*
Cunningham, Ross; Defect Formation Mechanisms in Powder-Bed Metal Additive Manufacturing; Carnegie Mellon University; Pittsburgh, PA; May 2018.
Francis, Zack; The Effects of Laser and Electron Beam Spot Size in Additive Manufacturing Processes; Carnegie Mellon University; Pittsburgh, PA; May 2017.
Trapp, Johannes, Rubenchik, Alexander, Guss, Gabe, Mattews, Manyalibo; In Situ Absorptivity Measurements of Metallic Powders During Laser Powder-Bed Fusion Additive Manufacturing; Applied Materials Today, 9(C); pp. 341-349; Dec. 2017.

* cited by examiner

*Primary Examiner* — Ryan F Pitaro
*Assistant Examiner* — Bernard E Cothran
(74) *Attorney, Agent, or Firm* — Jones Day

(57) ABSTRACT

Computer-implemented systems and methods are described herein for determining additive manufacturing parameters in a simulation. Input data regarding a product to be generated via additive manufacturing and a beam diameter are received. Based on the input data, a characteristic dimension is determined. The beam diameter is normalized based on the characteristic dimension. Additive manufacturing parameters, such as penetration depth and absorptivity, are determined based on the normalized beam diameter and experimentally-determined trends. The manufacturing of the product is then simulated according to the additive manufacturing parameters.

20 Claims, 10 Drawing Sheets

100

| Iteration | Absorptivity | Penetration Depth (um) | Simulation Width (um) | Simulation Depth (um) | Width % Error | Depth % Error |
|-----------|--------------|------------------------|-----------------------|-----------------------|---------------|---------------|
| 1 | 0.45 | 100 | 250 | 149 | -15% | -33% |
| 2 | 0.54 | 105 | 270 | 160 | -8% | -28% |
| 3 | 0.61 | 105 | 282 | 165 | -4% | -26% |
| 4 | 0.68 | 140 | 298 | 191 | 2% | -14% |
| 5 | 0.68 | 166 | 298 | 208 | 2% | -7% |
| 6 | 0.68 | 181 | 298 | 217 | 2% | -3% |

Figure 5

| Speed (m/s) | Power (W) | Wo (m) |
|---|---|---|
| 0.5 | 50 | 9.50E-05 |
| 0.5 | 100 | 1.29E-04 |
| 0.5 | 150 | 1.49E-04 |
| 0.5 | 200 | 1.66E-04 |
| 0.5 | 300 | 1.91E-04 |
| 0.5 | 400 | 2.06E-04 |
| 0.5 | 500 | 2.18E-04 |
| 0.75 | 50 | 8.09E-05 |
| 0.75 | 100 | 1.08E-04 |
| 0.75 | 150 | 1.26E-04 |
| 0.75 | 200 | 1.41E-04 |
| 0.75 | 300 | 1.63E-04 |
| 0.75 | 400 | 1.78E-04 |
| 0.75 | 500 | 1.89E-04 |
| 1 | 50 | 7.21E-05 |
| 1 | 100 | 9.64E-05 |
| 1 | 150 | 1.12E-04 |

Figure 6

DETERMINATION OF HEAT SOURCE ABSORPTIVITY AND PENETRATION DEPTH IN ADDITIVE MANUFACTURING MELT POOLS

CROSS-REFERENCE TO RELATED APPLICATIONS

This application claims priority to U.S. Provisional Application No. 62/958,896, filed Jan. 9, 2020, which is incorporated herein by reference in its entirety.

FIELD

The technology described herein relates generally to additive manufacturing and more specifically to calculating additive manufacturing parameters in a simulation.

BACKGROUND

Common heat source models for additive manufacturing simulations often utilize the penetration depth and absorptivity as inputs into the model. These quantities directly affect melt pool characteristics like melt pool dimension and cooling rates, which affect the resulting quality of a build. Unfortunately, it is difficult and time-consuming to correctly capture the penetration depth and absorptivity using available metrology techniques.

SUMMARY

In accordance with the teachings herein, computer-implemented systems and methods are provided for calculating additive manufacturing parameters in a simulation. The method comprises receiving input data regarding a product to be generated via additive manufacturing, including a beam diameter, and determining a characteristic dimension based on the input data. The method further comprises normalizing the beam diameter based on the characteristic dimension, and determining additive manufacturing parameters based on the normalized beam diameter. A manufacturing of the product is then simulated based on the determined additive manufacturing parameters.

A computer-implemented system for calculating additive manufacturing parameters in a simulation is further described herein, wherein the system comprises one or more data processors and one or more computer-readable storage mediums encoded with instructions for commanding the one or more data processors to execute steps that include the aforementioned method. A non-transitory computer-readable storage medium is further described herein, wherein the storage medium comprises instructions for which when executed cause a processing system to execute steps comprising the aforementioned method.

BRIEF DESCRIPTION OF THE DRAWINGS

FIG. 5 depicts example simulation iterations to determine an ideal penetration depth and absorptivity.

FIG. 6 depicts an example look-up table of characteristic dimensions for a material over various process parameters.

DETAILED DESCRIPTION

Computer-implemented systems and methods are provided herein for determining additive manufacturing ("AM") parameters in a simulation. Specifically, embodiments described herein can be used to determine penetration depth and absorptivity for a given material using experimentally-determined trends based on known process parameters, like beam diameter. After penetration depth and absorptivity are determined, product manufacturing can be simulated in accordance with the process parameters. These process parameters can then be used as part of an additive manufacturing process to manufacture one or more products. Further, the current subject matter provides techniques for determination of heat source absorptivity and penetration depth in additive manufacturing melt pools which can inform and be used when manufacturing one or more products.

Figure 1:
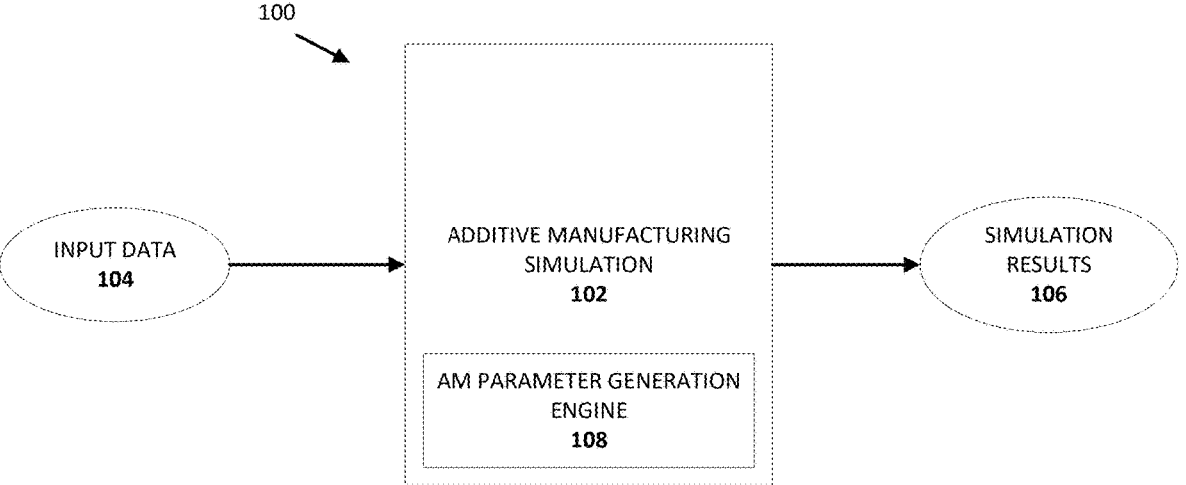
FIG. 1 is a block diagram depicting an embodiment of a computer-implemented additive manufacturing simulation for producing simulation results.

FIG. 1 depicts an embodiment of a computer-implemented environment 100 where an additive manufacturing simulation 102 produces simulation results 106 based on user input data 104. As discussed further below, additive manufacturing simulation 102 comprises AM parameter generation engine 108 which determines AM parameters, like penetration depth and absorptivity, of a material in accordance with user-defined process parameters. By creating relationships between these known process parameters and penetration depth and absorptivity, users can simulate product manufacturing across a large range of parameter sets based on a relatively small set of experiments.

Figure 2:
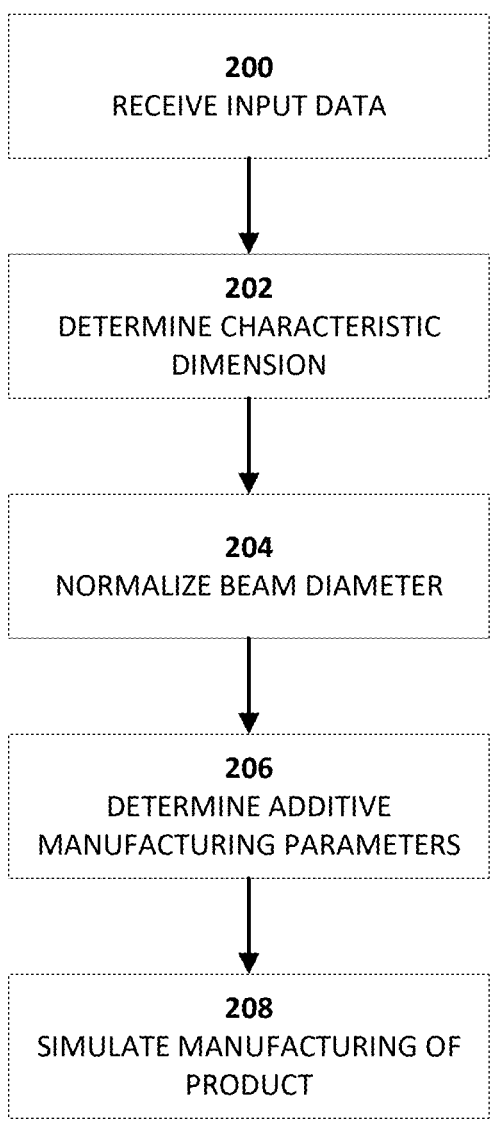
FIG. 2 is a flow diagram depicting an example method for determining additive manufacturing parameters in a simulation.

An example method for generating product manufacturing simulation data is described in FIG. 2. At 200, the simulation receives input data, such as substrate material, beam diameter, and other process parameters, from a user. The beam diameter is a dimension describing the size of the heat source on the surface of the substrate, or on a plane perpendicular to the beam's axis. Based on the user-defined input data, a characteristic dimension is determined at 202. As discussed in detail below, the characteristic dimension can be found by interpolating the input process parameters into a look-up table provided to the user. Then, at 204, the user-defined beam diameter is normalized based on the characteristic dimension. At 206, AM parameters, such as penetration depth and absorptivity, are determined via an AM parameter generation engine by interpolating the normalized beam diameter into experimentally-determined trends. In embodiments, the manufacturing of the product according to the input data and newly-found AM parameters is simulated at 208.

Figure 3:
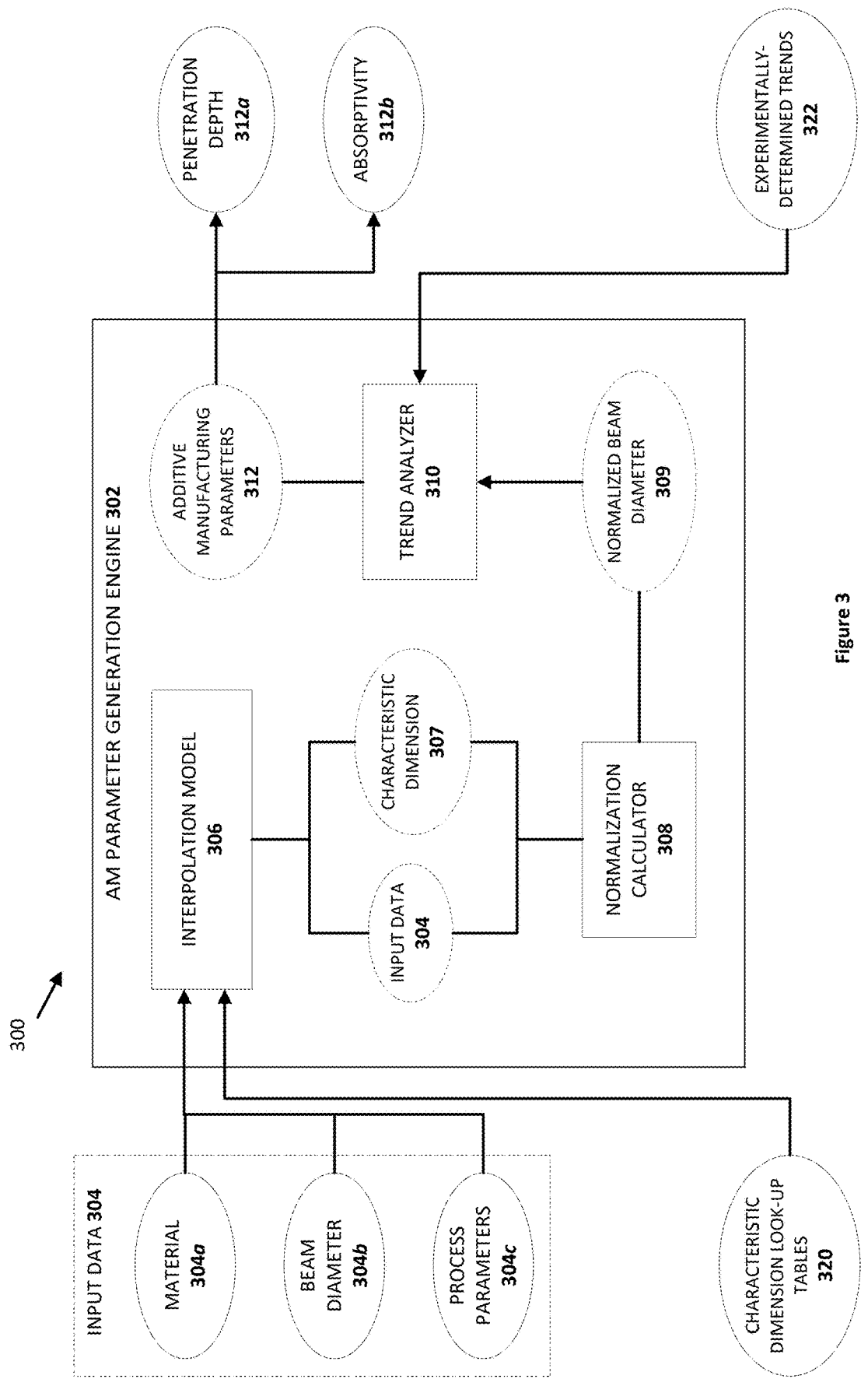
FIG. 3 is a block diagram depicting an embodiment of a computer-implemented engine for determining additive manufacturing parameters in a simulation.

An embodiment of the aforementioned generation engine is represented in FIG. 3. Specifically, FIG. 3 depicts a computer-implemented embodiment 300 where an AM parameter generation engine 302 determines AM parameters 312 via interpolation model 306, normalization calculator 308, and trend analyzer 310. In the FIG. 3 embodiment, substrate material 304a, beam diameter 304b, and other process parameters 304c (e.g., power, speed, layer thickness, etc.) are defined by a user as input data into the simulation-based engine. Based on the input data, interpolation model 306 determines a characteristic dimension 307 for the given material 304a. The characteristic dimension is an independent parameter isolated from the laser effect on the substrate material, thereby removing any energy density variability that occurs when lasers have different shapes, dimensions, etc.

In embodiments, interpolation model 306 determines the characteristic dimension 307 by interpolating the user-defined process parameters into a look-up table 320. For example, embodiments of look-up table 320 comprise characteristic dimensions at discrete parameter combinations. Look-up table 320 may comprise a number of data points representing characteristic dimensions as values of a function for a limited number of values of independent variables, each corresponding to a combination or a set of AM parameters. For a combination of user defined parameters that is not specifically specified (e.g., outside of the limited number of values of independent variables stored) in look-up table 320, the characteristic dimension corresponding to the user-defined parameters can be obtained via an interpolation to estimate a value of the function as represented in look-up table 320. Characteristic dimension look-up tables 320 can be created by running a range of simulations across a wide variety of inputs, as detailed with respect to FIGS. 4 and 6 below.

Returning to FIG. 3, input data 304 and the characteristic dimension 307 are processed in normalization calculator 308. Specifically, beam diameter 3046 is normalized based on the characteristic dimension 307. The normalized beam diameter 309 is then fit to experimentally-determined trend lines 322 via trend analyzer 310. In embodiments, trends 322 can represent the relationship or mapping between known input parameters, like normalized beam diameter, and a desired AM parameter output. Trends 322 can be applied to obtain a desired AM parameter from known input parameters. An example process to determine these trends will be detailed below with respect to FIGS. 4 and 7. In the FIG. 3 embodiment, trend analyzer 310 uses the normalized beam diameter 309 to determine the penetration depth 312a and absorptivity 312b of a given material manufactured according to the user-defined process parameters.

Figure 4:
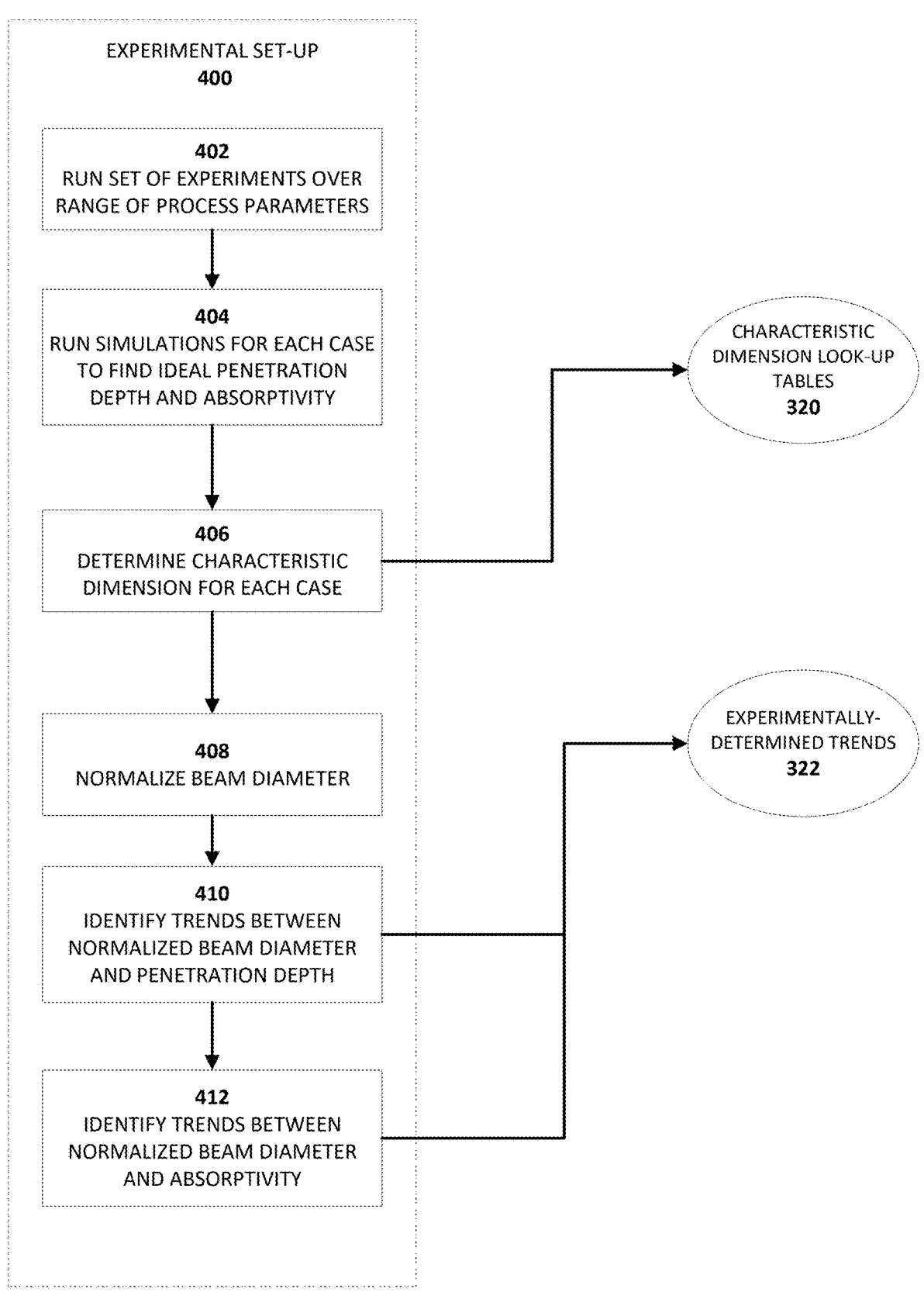
FIG. 4 is a flow diagram depicting an example method for determining additive manufacturing parameters based on experimentally-determined parameter trends in a simulation.

As discussed, characteristic dimension look-up tables 320 and experimentally-determined trends 322 are utilized by the generation engine to calculate AM parameters. To determine these inputs, an experimental set-up workflow may be utilized, an example of which is depicted in FIG. 4. Specifically, the experimental set-up 400 comprises (1) generating the aforementioned look-up tables of characteristic dimensions and (2) identifying parameter trends based on a normalized beam diameter, both for use during the user additive manufacturing simulation (e.g., the method of FIG. 2).

In the experimental set-up workflow 400, single bead experiments are run over a range of input process parameters (e.g., power, speed, layer thickness, size, etc.) at 402. For example, a set of experiments can be run for a given substrate using various power and speed input parameters. By varying the process parameters throughout the range of tests, general melt pool dimensions (e.g., cross-section, width, and depth of the melt pool) for a given material can be experimentally determined. At 404, simulations are run for each case to find the ideal penetration depth and absorptivity of the substrate when manufactured according to the input process parameters. In embodiments, the ideal penetration depth and absorptivity are determined by iterating simulations until there is a "match" between the simulation result and the experimental data of step 402.

For example, FIG. 5 depicts a data set corresponding to simulation iterations for a given substrate. In this example, the experimental cross-sectional width of the melt pool was determined to be 293 μm, and the experimental cross-sectional depth of the melt pool was determined to be 223 μm. These melt pool dimensions are examples of values established through the set of experiments described at step 402. As seen in the FIG. 5 data set, iterations of the simulation are performed until the input parameters produce a simulation result that "matches" the experimental melt pool dimensions (e.g., cross-sectional width and depth of the melt pool), or successfully meets some pre-defined error percentage. In the depicted data, iterations are performed until the absorptivity and extinction coefficient settings fall within 5% of the experimental dimensions. Accordingly, at iteration 6, the simulated width of the melt pool is 298 μm (within 5% of the experimental width 293 μm) and the simulated depth of the melt pool is 217 μm (within 5% of the experimental depth 223 μm), so the "ideal" absorptivity is 0.68 and the "ideal" penetration depth is 181 μm.

Returning to FIG. 4, a characteristic dimension is determined for each case at 406. It is calculated to be independent of such energy density variability that can occur when using different laser process parameters (e.g., power, speed, preheat, material absorptivity). In embodiments, characteristic dimensions can be identified by setting up simulations to eliminate the effects of heat source parameters, like penetration depth, diameter, and absorptivity, on the system. To do this, a point heat source is specified on the surface of the substrate and absorptivity is set to the minimum value found through the simulation-experiment comparisons. For example, simulations can be run across a range of parameters with the following fixed settings:

Penetration depth=0 μm;
Beam diameter=0 μm (or some other reasonably low value across all points);
Absorptivity=Low value according to experimental results (e.g., from step 402);
Layer thickness=0 (or a set low value across all points).

These simulations aid in identifying a characteristic dimension independent of the fixed variables. By varying other process parameters throughout iterations of the simulations, a characteristic dimension look-up table 320 for a given material at defined parameters can be created. For example, FIG. 6 depicts a sample look-up table generated by varying the power and speed inputs. In this embodiment, the width of the melt pool ($W_o$) is used as the characteristic dimension. Thus, the FIG. 6 table shows the maximum melt pool width ($W_o$) of iterations of the simulation, each run with the aforementioned heat source parameters fixed and power and speed varied. In embodiments, area or depth of the melt pool can also be used as the characteristic dimension.

Referring back to FIG. 3, generated characteristic dimension look-up tables 320 are utilized by the generation engine 302 when determining AM parameters. As discussed above, characteristic dimension 307 is determined based on user-defined input data via interpolation of look-up table 320.

Returning to the experimental set-up 400, each input beam diameter is normalized at 408 based on the determined characteristic dimension. In embodiments, the beam diameter is normalized according to the following equation:

$$\text{Normalized Beam Diameter} = \frac{\text{Beam Diameter}}{\text{Characteristic Dimension}}$$

Then, at 410 and 412, trends are identified between the normalized beam diameter and the ideal penetration depth and absorptivity identified in step 404 above. These trends 322 can represent relationships between the normalized beam diameter and other parameters, such as the penetration depth and absorptivity parameters. In one embodiment, the relationships represented in trends 322 may be linear based on, for example, linear equations. Beam diameter may be normalized or adjusted by characteristic dimensions to allow establishment or identification of trends 322. A product can then be built on the substrate by way of an additive manufacturing process using the generated additive manufacturing parameters having values that match the experimental data.

Figure 7A:
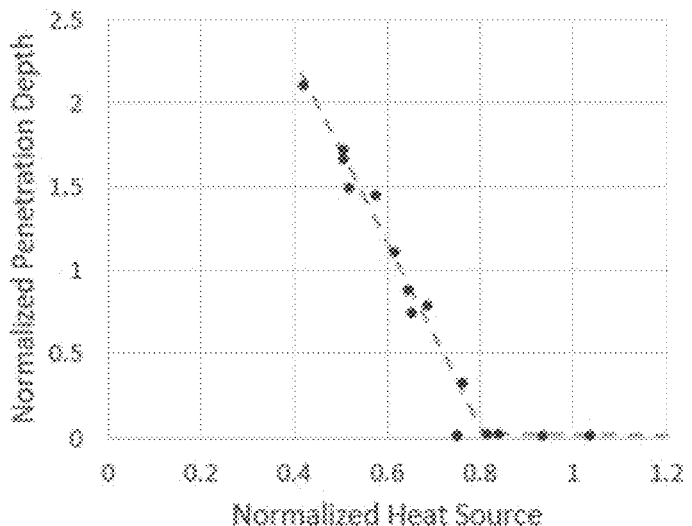
FIGS. 7A-7B depict examples of experimentally determined trends for determining penetration depth and absorptivity.
Figure 7B:
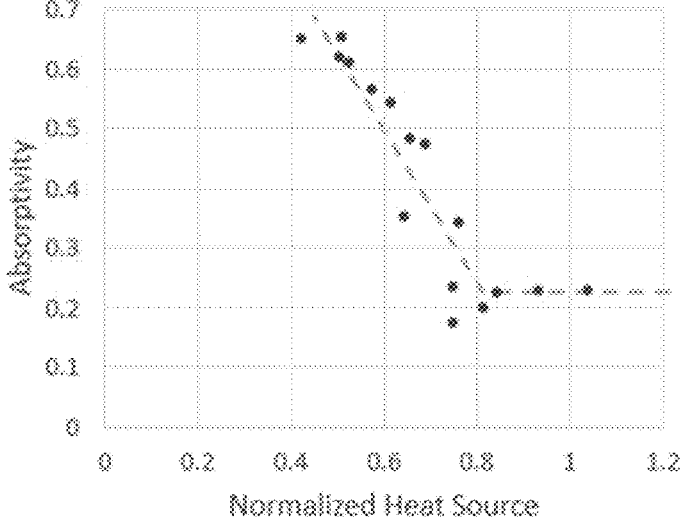

For example, FIGS. 7A and 7B depict sample trend lines for the $AlSi_{10}Mg$ substrate. In FIG. 7A, the normalized penetration depth (normalized based on the characteristic dimension) is plotted against the normalized heat source (i.e., normalized beam diameter). The dashed trend line is fit to the curve of the data points and serves to establish the relationship between the penetration depth and normalized beam diameter for the substrate. FIG. 7B depicts the same for absorptivity.

As discussed above with respect to FIG. 3, these experimentally-determined trends 322 are utilized by generation engine 302 to find the ideal AM parameters for the user's inputs. In embodiments, this is done via interpolation of the normalized beam diameter 309 into the trend lines via trend analyzer 310.

The methods and systems described herein may be implemented using any suitable processing system with any suitable combination of hardware, software and/or firmware, such as described below with reference to the non-limiting examples of FIGS. 8A, 8B, and 8C.

Figure 8A:
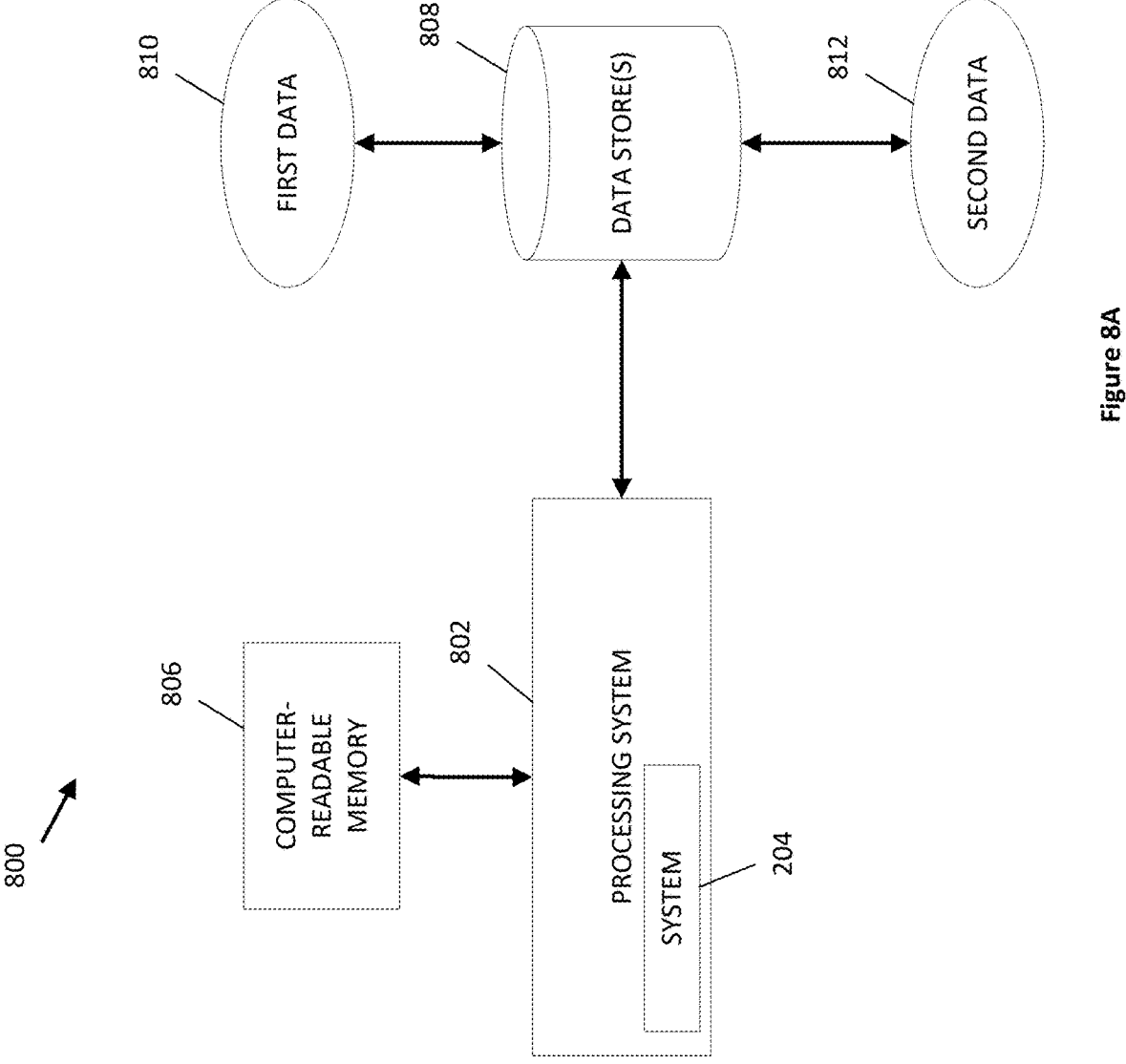
FIGS. 8A, 8B, and 8C depict example systems for use in implementing an additive manufacturing simulation.
Figure 8B:
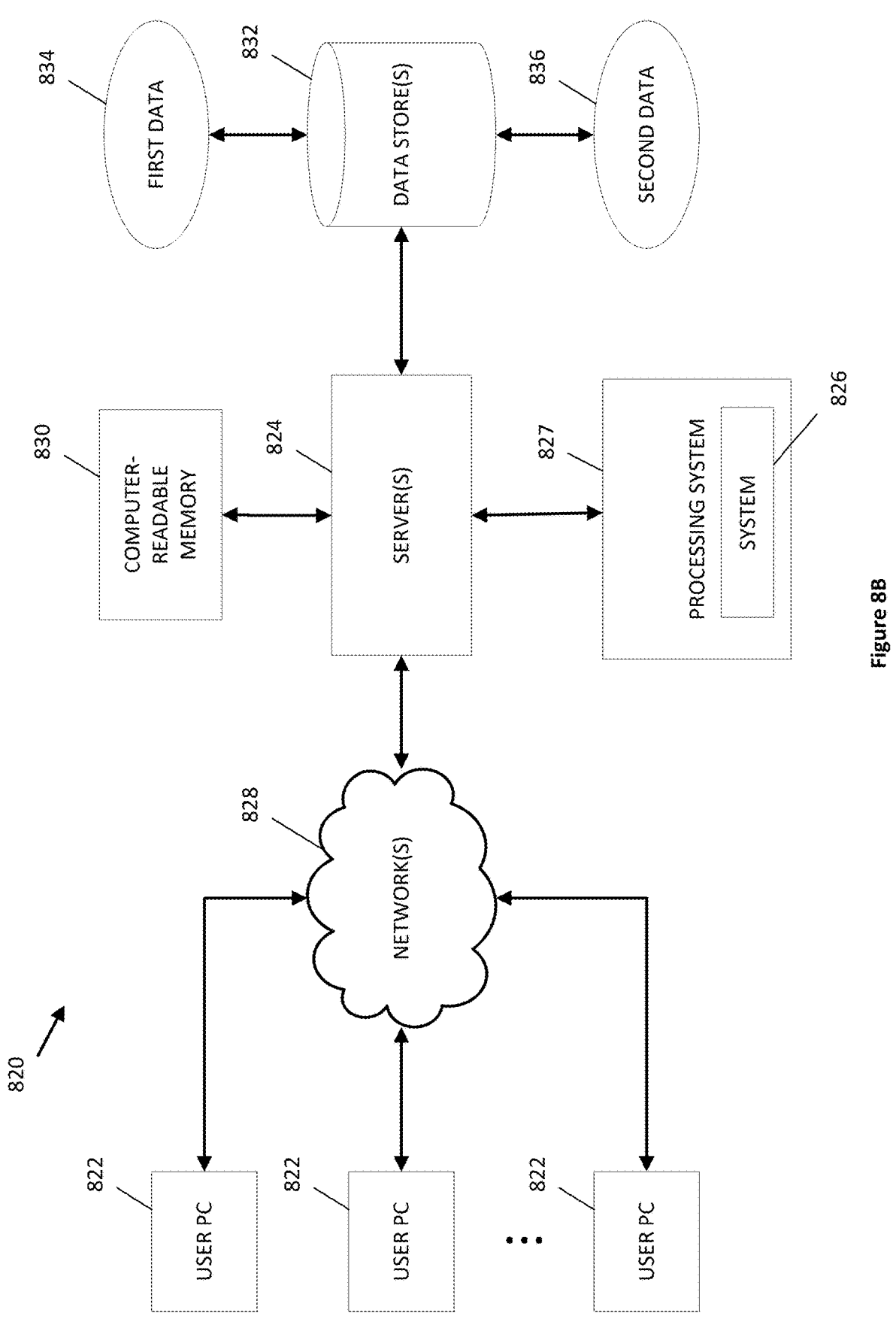
Figure 8C:
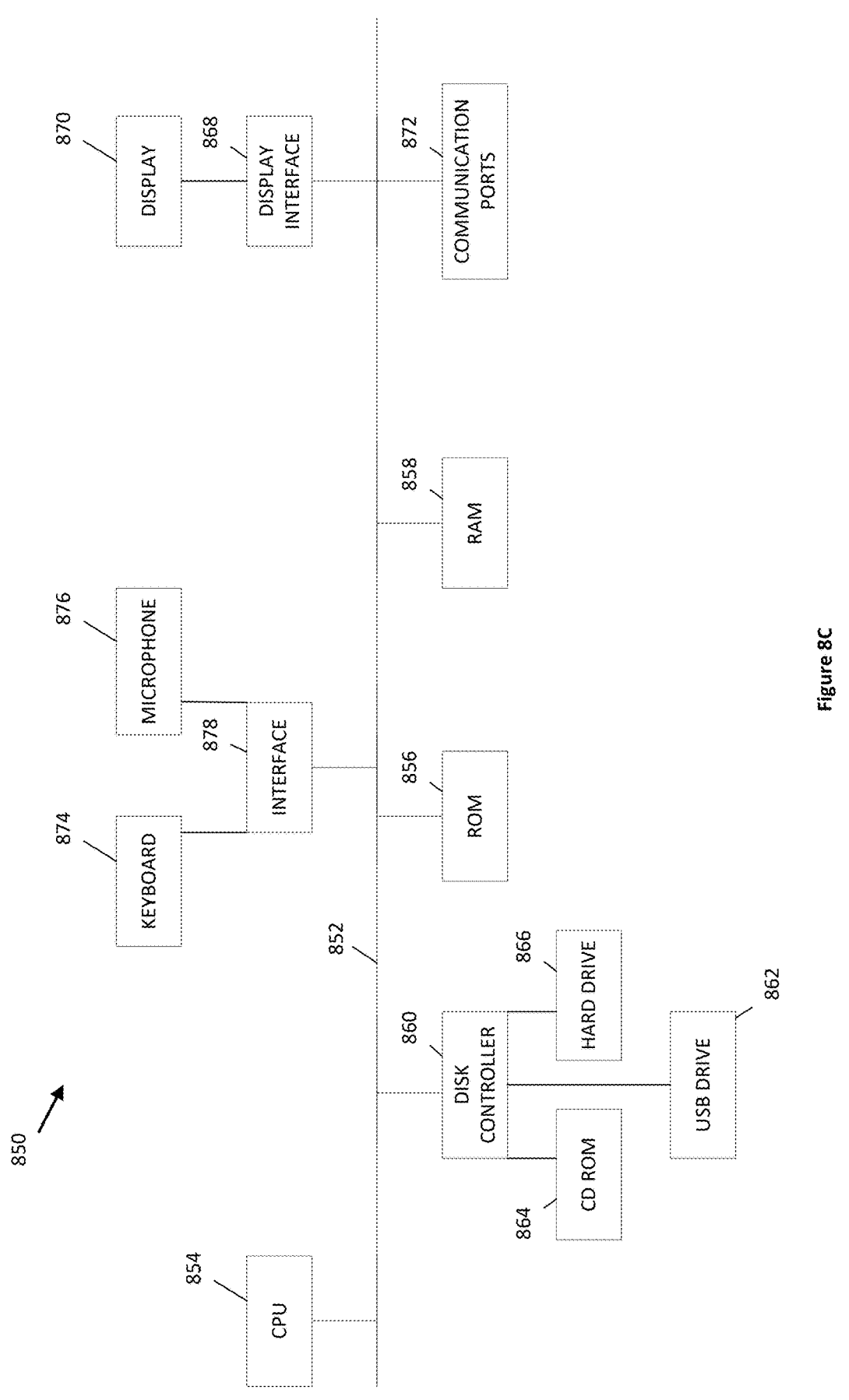

FIGS. 8A, 8B, and 8C depict example systems for use in implementing a system. For example, FIG. 8A depicts an exemplary system 800 that includes a standalone computer architecture where a processing system 802 (e.g., one or more computer processors) includes a system 804 being executed on it. The processing system 802 has access to a non-transitory computer-readable memory 806 in addition to one or more data stores 808. The one or more data stores 808 may contain first data 810 as well as second 812.

FIG. 8B depicts a system 820 that includes a client server architecture. One or more user PCs 822 access one or more servers 824 running a system 826 on a processing system 827 via one or more networks 828. The one or more servers 824 may access a non-transitory computer readable memory 830 as well as one or more data stores 832. The one or more data stores 832 may contain first data 834 as well as second data 836.

FIG. 8C shows a block diagram of exemplary hardware for a standalone computer architecture 850, such as the architecture depicted in FIG. 8A, that may be used to contain and/or implement the program instructions of system embodiments of the present invention. A bus 852 may serve as the information highway interconnecting the other illustrated components of the hardware. A processing system 854 labeled CPU (central processing unit) (e.g., one or more computer processors), may perform calculations and logic operations required to execute a program. A non-transitory computer-readable storage medium, such as read only memory (ROM) 856 and random access memory (RAM) 858, may be in communication with the processing system 854 and may contain one or more programming instructions. Optionally, program instructions may be stored on a non-transitory computer-readable storage medium such as a magnetic disk, optical disk, recordable memory device, flash memory, or other physical storage medium. Computer instructions may also be communicated via a communications signal, or a modulated carrier wave, e.g., such that the instructions may then be stored on a non-transitory computer-readable storage medium.

A disk controller 860 interfaces one or more optional disk drives to the system bus 852. These disk drives may be external or internal floppy disk drives such as 862, external or internal CD-ROM, CD-R, CD-RW or DVD drives such as 864, or external or internal hard drives 866. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 860, the ROM 856 and/or the RAM 858. Preferably, the processor 854 may access each component as required.

A display interface 878 may permit information from the bus 852 to be displayed on a display 870 in audio, graphic, or alphanumeric format. Communication with external devices may optionally occur using various communication ports 872.

In addition to the standard computer-type components, the hardware may also include data input devices, such as a keyboard 874, or other input device 876, such as a microphone, remote control, pointer, mouse and/or joystick.

This written description describes exemplary embodiments of the invention, but other variations fall within scope of the disclosure. For example, the systems and methods may include and utilize data signals conveyed via networks (e.g., local area network, wide area network, internet, combinations thereof, etc.), fiber optic medium, carrier waves, wireless networks, etc. for communication with one or more data processing devices. The data signals can carry any or all of the data disclosed herein that is provided to or from a device.

The methods and systems described herein may be implemented on many different types of processing devices by program code comprising program instructions that are executable by the device processing system. The software program instructions may include source code, object code, machine code, or any other stored data that is operable to cause a processing system to perform the methods and operations described herein. Any suitable computer languages may be used such as C, C++, Java, etc., as will be appreciated by those skilled in the art. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other non-transitory computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes the plural reference unless the context clearly dictates otherwise. Also, as used in the description herein and throughout the claims that follow, the meaning of "in" includes "on" unless that context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate a situation where only the disjunctive meaning may apply.

The invention has been described with reference to particular exemplary embodiments. However, it will be readily apparent to those skilled in the art that it is possible to embody the invention in specific forms other than those of the exemplary embodiments described above. The embodiments are merely illustrative and should not be considered restrictive. The scope of the invention is reflected in the claims, rather than the preceding description, and all variations and equivalents which fall within the range of the claims are intended to be embraced therein.

It is claimed:

1. A computer-implemented method for providing a digital computer simulation for calculating additive manufacturing parameters comprising:

accessing experimental data characterizing general melt pool dimensions for a given material, the experimental data being based on a plurality of manufacturing experiments performed using an additive manufacturing system, the experiments being for a given substrate using varying speed and input parameters of the additive manufacturing system;

generating, by at least one data processor, a look-up table based on the experiments, the look-up table correlates parameters used for the experiments to a characteristic dimension;

receiving, by at least one data processor, input data regarding a product to be generated via additive manufacturing and a beam diameter;

determining, by at least one data processor, that an entry corresponding to the received input data is not in the look-up table;

initializing, by at least one data processor and in response to the determination that an entry corresponding to the received input data is not in the look-up table, an interpolation model to determine a characteristic dimension based on the input data and the look-up table;

normalizing, by at least one data processor, the beam diameter based on the beam diameter divided by the characteristic dimension; and simulating, by at least one data processor and using the initialized interpolation model, manufacturing of the product based on the input data and the normalized beam diameter to determine additive manufacturing parameters, the simulating comprising iterative simulations to generate additive manufacturing parameters until such time that values of the generated additive manufacturer parameters match the experimental data, the simulations being configured to eliminate effects of heat source parameters.

2. The method of claim 1, wherein the additive manufacturing parameters comprise absorptivity and penetration depth.

3. The method of claim 1, further comprising adjusting the additive manufacturing parameters based on a user-defined layer thickness.

4. The method of claim 1, wherein the input data comprises process parameters including speed and power.

5. The method of claim 4, wherein the look-up table comprises a number of data points representing characteristic dimensions as values of a function for a limited number of values of independent variables, each corresponding to a combination or a set of additive manufacturing parameters.

6. The method of claim 1, wherein determining additive manufacturing parameters based on the normalized beam diameter comprises:

(a) receiving an experimentally-determined trend line defining a relationship between a first additive manufacturing parameter and a range of normalized beam diameters;

(b) determining the first additive manufacturing parameter via interpolation of the normalized beam diameter into the trend line; and (c) repeating (a) and (b) for each additive manufacturing parameter to be determined.

7. The method of claim 1, wherein:

the conducted experiments comprise single bead experiments run over a range of input process parameters;

the product is built on the substrate by way of an additive manufacturing process using the generated additive manufacturing parameters having values that match the experimental data.

8. A computer-implemented system comprising:

one or more data processors;

one or more computer-readable storage mediums encoded with instructions for commanding the one or more data processors to execute operations comprising:

receiving input data regarding a product to be generated via additive manufacturing and a beam diameter;

determining that an entry corresponding to the received input data is not in a look-up table, the look-up table being generated by conducting experiments to obtain experimental data characterizing general melt pool dimensions for a given material based on a plurality of manufacturing experiments for a given substrate using varying speed and input parameters;

initializing, in response to the determination that an entry corresponding to the received input data is not in the look-up table, an interpolation model to determine a characteristic dimension based on the input data and the look-up table;

normalizing the beam diameter based on the characteristic dimension; and simulating, based on the initialized interpolation model, manufacturing of the product based on the input data and the normalized characteristic dimension to determine additive manufacturing parameters, the simulating comprising iterative simulations to generate additive manufacturing parameters until such time that values of the generated additive manufacturer parameters match experimental data generated from a plurality of manufacturing experiments for a given substrate using varying power and speed input parameters, the simulations being configured to eliminate effects of heat source parameters;

wherein the product is built on the substrate by way of an additive manufacturing process using the generated additive manufacturing parameters having values that match the experimental data.

9. The computer-implemented system of claim 8, wherein the additive manufacturing parameters comprise absorptivity and penetration depth.

10. The computer-implemented system of claim 8, wherein the operations further comprise: adjusting the additive manufacturing parameters based on a user-defined layer thickness.

11. The computer-implemented system of claim 8, wherein the input data comprises process parameters including speed and power.

12. The computer-implemented system of claim 11, wherein the look-up table comprises a number of data points representing characteristic dimensions as values of a function for a limited number of values of independent variables, each corresponding to a combination or a set of additive manufacturing parameters.

13. The computer-implemented system of claim 8, wherein determining additive manufacturing parameters based on the normalized beam diameter comprises:

(a) receiving an experimentally-determined trend line defining a relationship between a first additive manufacturing parameter and a range of normalized beam diameters;

(b) determining the first additive manufacturing parameter via interpolation of the normalized beam diameter into the trend line; and (c) repeating (a) and (b) for each additive manufacturing parameter to be determined.

14. The system of claim 8, wherein the conducted experiments comprise single bead experiments run over a range of input process parameters.

15. A non-transitory computer-readable storage medium comprising instructions for which when executed cause a processing system to execute operations comprising:

receiving input data regarding a product to be generated via additive manufacturing and a beam diameter;

determining that an entry corresponding to the received input data is not in a look-up table, the look-up table being generated by conducting experiments to obtain experimental data characterizing general melt pool dimensions for a given material based on a plurality of manufacturing experiments for a given substrate using varying speed and input parameters;

determining, using an interpolation model and in response to determining that the entry corresponding to the received input data is not in the look-up table, a characteristic dimension based on the input data and the look-up table;

normalizing the beam diameter based on the characteristic dimension; and simulating, based on the initialized interpolation model, manufacturing of the product based on the input data and the normalized characteristic dimension to determine additive manufacturing parameters, the simulating comprising iterative simulations to generate additive manufacturing parameters until such time that values of the generated additive manufacturer parameters match experimental data generated from a plurality of manufacturing experiments for a given substrate using varying power and speed input parameters, the simulations being configured to eliminate effects of heat source parameters;

wherein the product is built on the substrate by way of an additive manufacturing process using the generated additive manufacturing parameters having values that match the experimental data.

16. The non-transitory computer-readable storage medium of claim 15, wherein the additive manufacturing parameters comprise absorptivity and penetration depth.

17. The non-transitory computer-readable storage medium of claim 15, wherein the operations further comprise: adjusting the additive manufacturing parameters based on a user-defined layer thickness.

18. The non-transitory computer-readable storage medium of claim 15, wherein the input data comprises process parameters including speed and power.

19. The non-transitory computer-readable storage medium of claim 18, wherein the look-up table comprises a number of data points representing characteristic dimensions as values of a function for a limited number of values of independent variables, each corresponding to a combination or a set of additive manufacturing parameters.

20. The non-transitory computer-readable storage medium of claim 15, wherein determining additive manufacturing parameters based on the normalized beam diameter comprises:

(a) receiving an experimentally-determined trend line defining a relationship between a first additive manufacturing parameter and a range of normalized beam diameters;

(b) determining the first additive manufacturing parameter via interpolation of the normalized beam diameter into the trend line; and (c) repeating (a) and (b) for each additive manufacturing parameter to be determined.

* * * * *